United States Patent
Thomas et al.

(10) Patent No.: US 11,127,865 B2
(45) Date of Patent: Sep. 21, 2021

(54) INTEGRATED ENERGY HARVESTING AND STORAGE DEVICE

(71) Applicant: University of Central Florida Research Foundation, Inc., Orlando, FL (US)

(72) Inventors: Jayan Thomas, Orlando, FL (US); Chao Li, Oviedo, FL (US); Chait Renduchintala, Orlando, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 7 days.

(21) Appl. No.: 16/052,205

(22) Filed: Aug. 1, 2018

(65) Prior Publication Data
US 2019/0067497 A1 Feb. 28, 2019

Related U.S. Application Data

(63) Continuation-in-part of application No. PCT/US2017/016807, filed on Feb. 7, 2017.
(Continued)

(51) Int. Cl.
| | |
|---|---|
| *H01L 31/0224* | (2006.01) |
| *H01M 10/0525* | (2010.01) |
| *H02J 7/35* | (2006.01) |
| *H01M 14/00* | (2006.01) |
| *H01L 31/042* | (2014.01) |

(Continued)

(52) U.S. Cl.
CPC ... *H01L 31/022425* (2013.01); *D03D 1/0076* (2013.01); *D03D 1/0088* (2013.01); *D03D 15/46* (2021.01); *H01G 9/2068* (2013.01); *H01L 31/042* (2013.01); *H01L 31/053* (2014.12); *H01M 10/0459* (2013.01); *H01M 10/0525* (2013.01); *H01M 14/005* (2013.01); *H02J 7/35* (2013.01); *H02S 40/38* (2014.12);
(Continued)

(58) Field of Classification Search
None
See application file for complete search history.

(56) References Cited

U.S. PATENT DOCUMENTS

| | | | |
|---|---|---|---|
| 2007/0207693 A1* | 9/2007 | Tsukuda | H01G 9/02 442/381 |
| 2009/0151043 A1 | 6/2009 | Moreshead | |

(Continued)

OTHER PUBLICATIONS

Du, Pengcheng et al., "Self-Powered Electronics by Integration of Flexible Solid-State Graphene-Based Supercapacitors with High Performance Perovskite Hybrid Solar Cells", Advanced Functional Materials, 2015, 25, pp. 2420-2427. (Year: 2015).*
(Continued)

*Primary Examiner* — Tamir Ayad
(74) *Attorney, Agent, or Firm* — Fleit Intellectual Property Law; Thomas S. Grzesik

(57) ABSTRACT

An integrated energy harvesting and storage device (IEHSD) includes a solar cell (SC) including an active layer between an optically transparent top electrode and a bottom electrode, and an energy storage device (SD) secured below the solar cell including a separator between a first electrode and a second electrode. The bottom electrode and the first or second electrode are electrically common with one another and are within a distance of ≤300 μm from one another.

17 Claims, 7 Drawing Sheets

Related U.S. Application Data

(60) Provisional application No. 62/292,621, filed on Feb. 8, 2016.

(51) Int. Cl.

| | | |
|---|---|---|
| *H01G 9/20* | (2006.01) |
| *H01L 31/053* | (2014.01) |
| *H02S 40/38* | (2014.01) |
| *D03D 1/00* | (2006.01) |
| *D03D 15/46* | (2021.01) |
| *H01M 10/04* | (2006.01) |
| *H01L 51/42* | (2006.01) |

(52) U.S. Cl.
CPC ...... *D10B 2101/20* (2013.01); *D10B 2401/18* (2013.01); *D10B 2401/20* (2013.01); *H01L 51/42* (2013.01)

(56) References Cited

U.S. PATENT DOCUMENTS

| | | | |
|---|---|---|---|
| 2012/0219831 A1* | 8/2012 | Mak | B82Y 10/00 429/9 |
| 2013/0147420 A1 | 6/2013 | Wei et al. | |
| 2013/0162192 A1 | 6/2013 | Park et al. | |
| 2015/0122791 A1* | 5/2015 | Hung | H05B 1/0272 219/211 |
| 2015/0340639 A1* | 11/2015 | Matsuura | C25D 1/04 257/741 |
| 2015/0372249 A1 | 12/2015 | Parent | |

OTHER PUBLICATIONS

Li, Chao et al., "Wearable energy-smart ribbons for synchronous energy harvest and storage"; Nature Communications, 7:13319; DOI: 10.1038/ncomms13319; pp. 1-10. (Year: 2016).*

Sepahvand, S. et al., "Electric Field Enhanced Synthesis of Copper Hydroxide Nanostructures for Supercapacitor Application"; World Scientific, vol. 12, No. 1, (Nov. 30, 2016) 1750010, pp. 1-9. (Year: 2016).*

Zhang, Daohong et al., "High Performance Carbon Nanotube Yarn Supercapacitors with a Surface-Oxidized Copper Current Collector"; ACS Applied Materials and Interfaces, 2015, 7, DOI: 10.1021/acsami.5b08110; pp. 25835-25842. (Year: 2015).*

Lu, Yang et al, "Cost-effective CuO nanotube electrodes for energy storage and non-enzymatic glucose detection", RSC Adv. 2014, 4, 46814-46822. (Year: 2014).*

* cited by examiner

INTEGRATED ENERGY HARVESTING AND STORAGE DEVICE

CROSS REFERENCE TO RELATED APPLICATIONS

This application is a continuation-in-part (CIP) application under 35 U.S.C. 111(a) that claims priority to PCT/US17/16807 entitled "AN INTEGRATED ENERGY HARVESTING AND STORAGE DEVICE" filed on Feb. 7, 2017 which claims priority to provisional patent application 62/292,621 entitled "AN ENERGY HARVESTING DEVICE AND STORAGE DEVICE WEAVED TOGETHER" filed on Feb. 8, 2016, both of which are incorporated herein in their entireties.

FIELD

Disclosed embodiments relate to combined energy harvesting and storage devices.

BACKGROUND

A solar cell is an example of an energy harvesting (or energy generation) device. In some applications it is needed to store the power generated by the energy harvesting device. Energy harvesting devices can comprise solar cells and storage devices can include batteries or supercapacitors. To meet some industry and military requirements global research has included the development of new combined energy harvesting and rechargeable energy storage devices with some combined devices being called "solar batteries".

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize because known solar batteries lack an integrated shared electrode between the solar cell (SC) and energy storage device (SD) their energy efficiency is significantly reduced by the loss of power which occurs when solar generated electrons travel a significant distance between the SC and the SD. Disclosed embodiments include an all-solid-state integrated energy harvesting and storage device (IEHSD) which includes at least one SC including an active layer between an optically transparent top electrode and a bottom electrode, and at least one SD secured below the solar cell including a separator between a first electrode and a second electrode. The bottom electrode of the SC and the first or second electrode (either positive or negative electrode) of the SD are electrically common with one another and are generally within a distance of ≤300 µm, such as ≤10 µm of one another, or ≤1 µm.

The bottom electrode of the SC and the first or second electrode of the SD can be secured together by an electrically conductive adhesive. In another embodiment the SC and first or second electrode of the SD can be on opposite sides of a single shared metal material so that the electrode separation distance between the SC and SD is 0, such as using a copper ribbon.

Another disclosed embodiment comprises a weaved IEHSD. The weaved IEHSD comprises a plurality of SC filaments (e.g., copper ribbons) aligned with one another, and the SD comprises a plurality of SD filaments located below the SC filaments to provide a plurality of stacked SC/SD filaments. The SD filaments and SC filaments generally share an electrically common electrode. A yarn material comprises first vertical yarns oriented in a vertical direction and second horizontal yarns oriented in a horizontal direction, where the vertical yarns and horizontal yarns are interlaced together to provide a fabric.

DETAILED DESCRIPTION

Figure 1A:
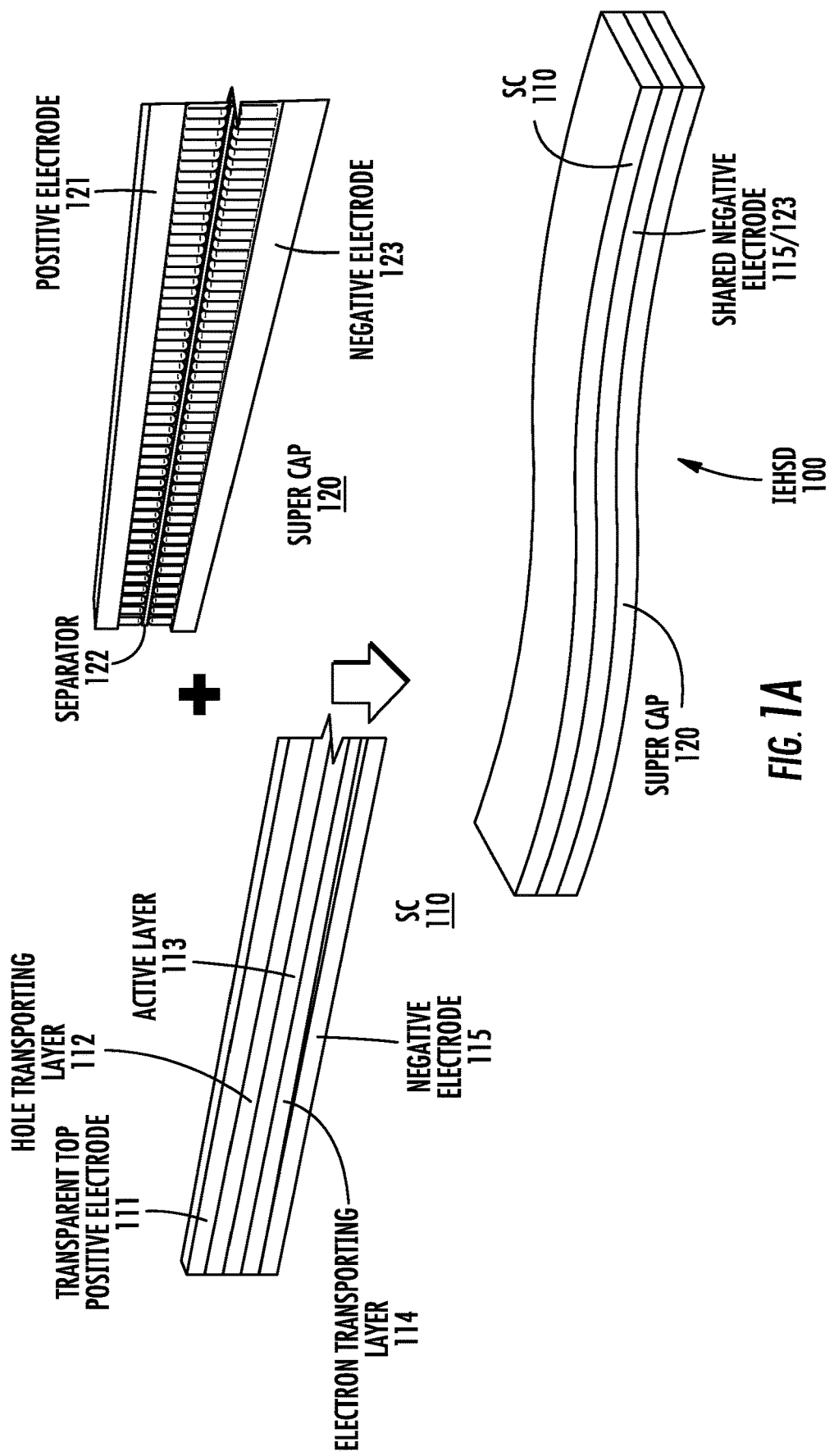
FIG. 1A depicts the integration of a SC and a supercapacitor (super cap) to provide a disclosed IEHSD. The negative electrode is shown as a shared electrode and the positive electrode of the SC is connected to the positive electrode of the super cap through a switch during fabrication.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1A shows the integration of a SC 110 and a super cap 120 shown as an asymmetric super cap to provide a disclosed IEHSD 100. The negative electrode for the SC 110 and super cap 120 is shown as the shared negative electrode 115/123 and the optically transparent positive electrode 111 of the SC 110 can be connected to the positive electrode 121 of the super cap 120 through a switch during fabrication of the IEHSD 100. Alternatively, the shared electrode can be the positive electrode and the respective negative electrodes can be connected through a switch. In this embodiment the shared negative electrode 115/123 configures the negative electrode of the SC 110 and the negative electrode of the super cap 120 on opposite sides of single metal material so that the electrode separation distance between the SC 110 and super cap 120 is 0, such as using a copper ribbon for the shared negative electrode 115/123.

The positive electrode 111 can comprise indium tin oxide (ITO) or other transparent electrically conducting film. The SC 110 also includes a hole transport layer 112, and active layer 113, an electron transport layer 114, the negative electrode 115 noted above. The SC 110 can comprise a perovskite-based SC cell or comprise a silicon-based SC.

The super cap 120 comprises a positive electrode 121, a separator 122, and the negative electrode 123 described above. As used herein a super cap takes on its conventional meaning of a capacitive structure that does not use a conventional solid dielectric, but rather uses electrostatic double-layer capacitance and electrochemical pseudo-capacitance, both of which contribute to the total capacitance of the super cap typically storing 10 to 100 times more energy per unit volume or mass as compared to electrolytic capacitors. The electrolyte of a super cap forms an ionic conductive connection between the two electrodes which distinguishes them from conventional electrolytic capacitors where a dielectric layer always exists, and the so-called electrolyte (e.g., $MnO_2$ or conducting polymer) is in fact part of the second electrode being the cathode, or more correctly the positive electrode.

The shared negative electrode 115/123 not only serves as an electron-collecting electrode for the SC 110 but also as a substrate, such as for growing the copper hydroxide nanotube (CuOHNT) electrodes shown in FIG. 2A described below for forming the super cap 120. A symmetric super cap can be developed in one particular embodiment by gluing a second CuOHNT-based Cu ribbon with polyvinyl alcohol (PVA) containing potassium hydroxide (KOH) gel electrolyte onto the CuOHNT grown side of the copper ribbon electrode of the SC 110. As known in the art of solar technology, a metal ribbon is a long, thin flexible band of metal used as the metal substrate in thin film solar modules. Making use of a shared electrode shown as the shared negative electrode 115/123, the charges generated by the SC 110 are directly transferred and stored across the positive electrode 121 and negative electrode 123 of the super cap 120, shown as CuOHNT electrodes 121' and 123' in FIGS. 2A and FIG. 2B, respectively described below.

Figure 1B:
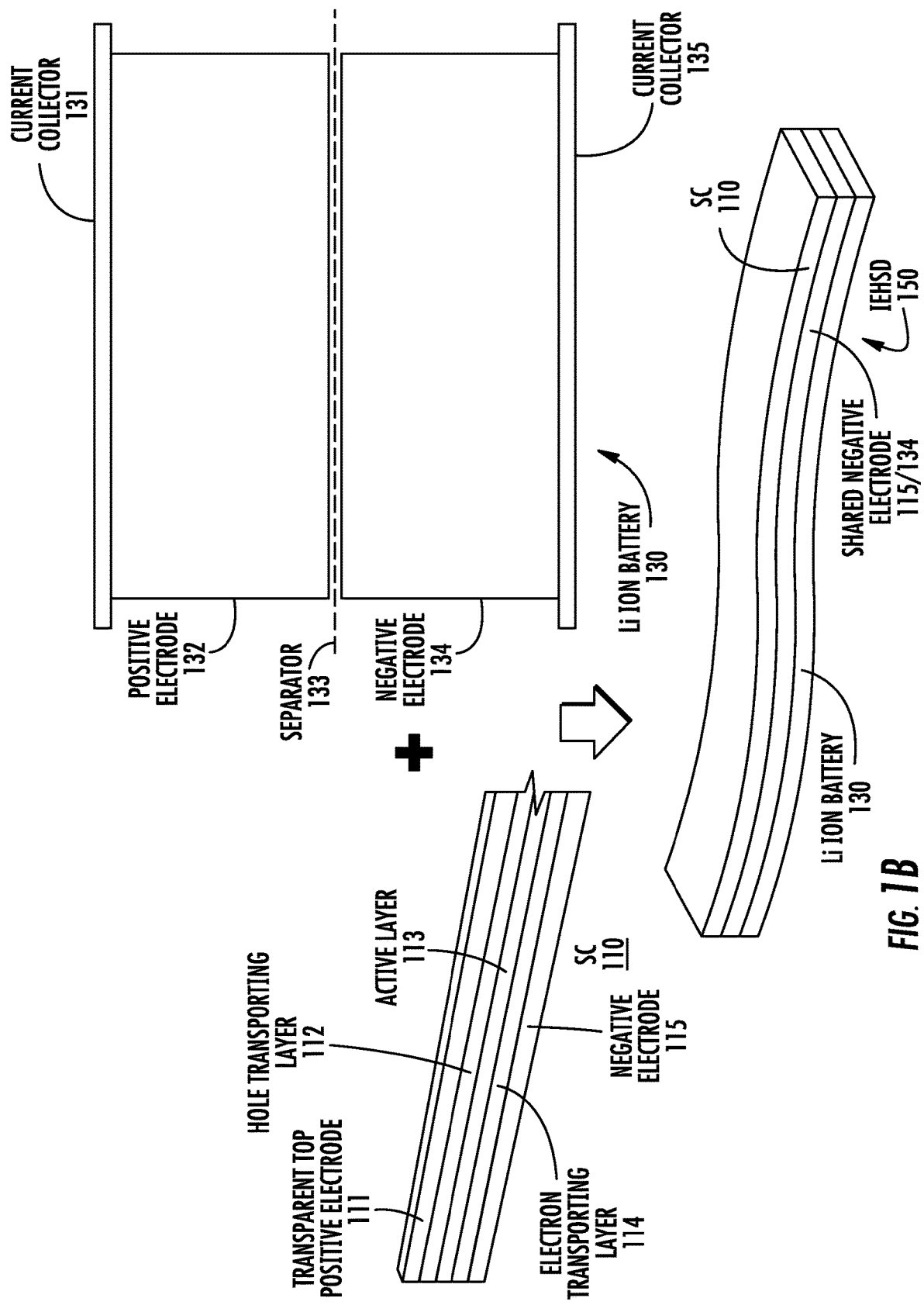
FIG. 1B shows the integration of a SC or a lithium ion battery to provide a disclosed IEHSD. The negative electrode is again shown as a shared electrode and the positive electrode of SC is connected to the positive electrode of the battery through a switch during fabrication.

Since the energy density of Li-ion batteries is generally higher than that of super caps, fabricating thin-film Li-ion batteries instead of super caps on the reverse side of the SC metal ribbon can considerably improve the energy density of the IEHSD. FIG. 1B shows the integration of a SC 110 and a lithium ion (Li ion) battery 130 using a shared negative electrode shown as 115/134 to provide a stacked SC/lithium ion battery IEHSD 150. The Li ion battery 130 is shown comprising a current collector 131, a positive electrode 132, a separator 133, a negative electrode 134, and a current collector 135.

Figure 1C:
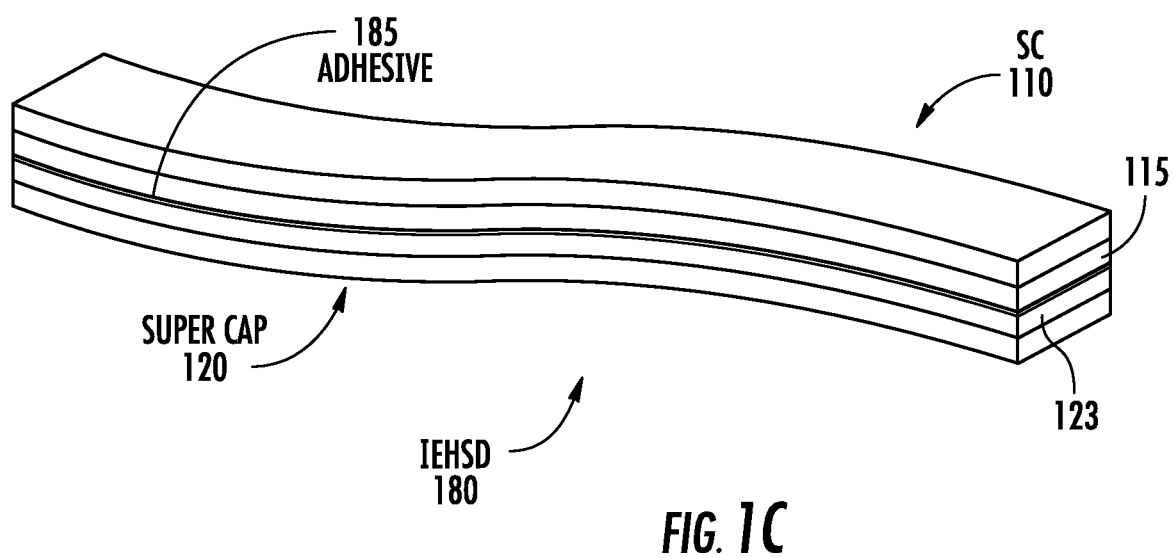
FIG. 1C shows a disclosed IEHSD 180 where the negative electrode of the SC and the negative electrode of the super cap are secured together by an electrically conductive adhesive.

The bottom electrode of the SC 110 and the first or second electrode of the super cap 120 can also be secured together by an electrically conductive adhesive. FIG. 1C shows an example IEHSD 180 where the negative electrode 115 of the SC 110 and the negative electrode 123 of the super cap 120 are on separate materials that are secured together by an electrically conductive adhesive 185. The electrically conductive adhesive 185 can comprise a metal epoxy such as a heat curable silver, copper or other metal filled epoxy that is generally 0.01-5 μm thick which generally provides a room temperature electrical resistivity of 0.001 Ω·cm to 200 Ω·cm.

Figure 2A:
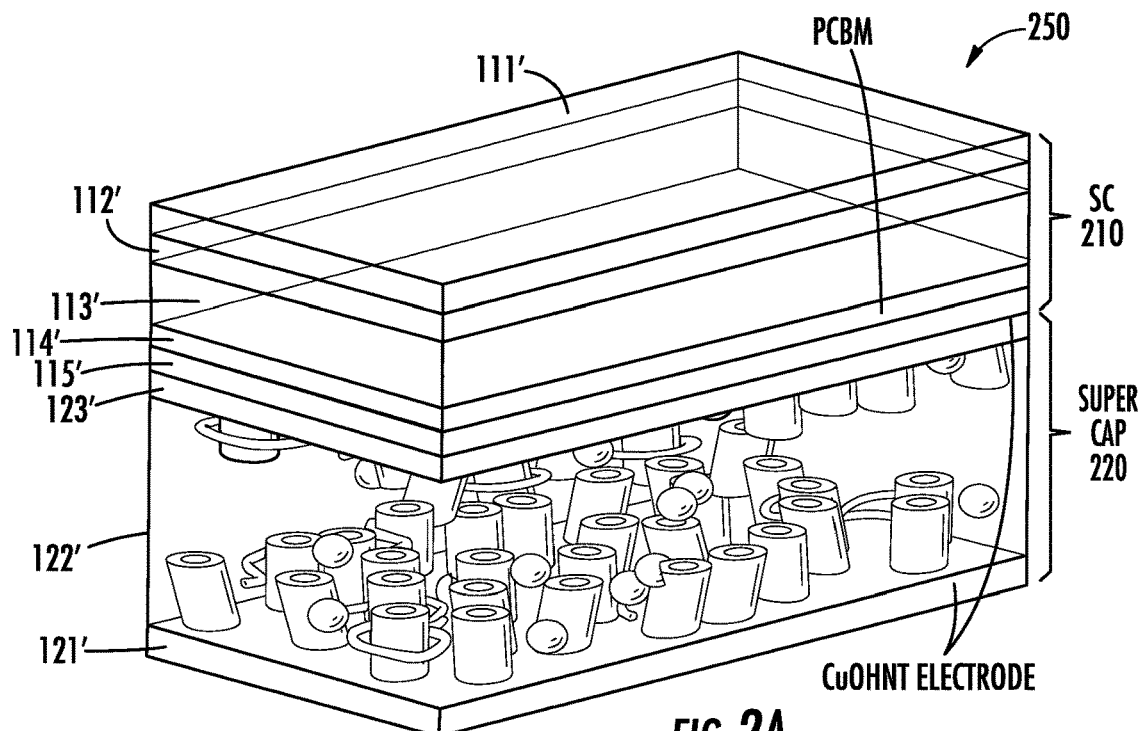
FIG. 2A is a schematic perspective cross section showing an example disclosed IEHSD comprising a SC filament stacked on a super cap filament.

FIG. 2A is a schematic perspective cross sectional view of an example IEHSD 250 comprising a SC 210 stacked on a super cap 220, wherein the SC 210 is shown as a perovskite solar cell which has an electrically common negative electrode 115' (from the SC 210) in direct contact with the negative electrode 123' from the super cap 220. However, a thin film silicon solar cell can be used instead of perovskite SC which can perform essentially the same harvesting function.

Figure 2B:
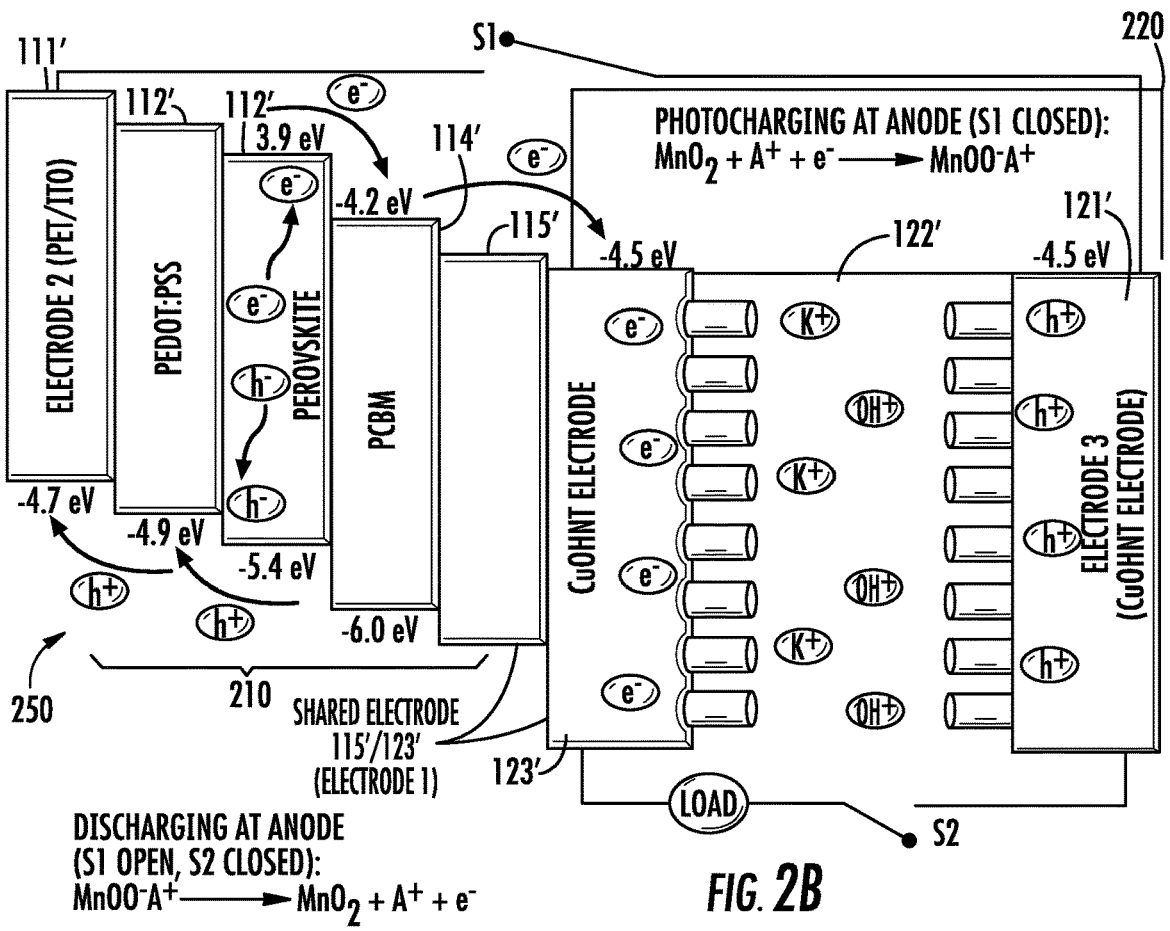
FIG. 2B shows the charge transfer mechanism of a disclosed IEHSD along with terminal connections including switches S1 and S2, where with S1 closed and S3 open the photogenerated holes and electrons from the SC flow into the cathode and anode of SC, respectively. The energy stored through the charging process can be discharged to do external work (with S1 open and S2 closed).

The SC 210 comprises an optically transparent top positive electrode 111', a hole transport layer 112', a light harvesting (active) perovskite layer 113', an electron transport layer 114' shown as a PCBM layer (phenyl-C61-butyric acid methyl ester (PCBM) generally as a $PBCM/ZnO/TiO_2$ electron transport layer (ETL) and a negative electrode 115' generally being a copper ribbon that is directly contacting the negative electrode 123' of the super cap 220 to provide a shared electrode 115'/123' (Electrode 1 shown in FIG. 2B). However, generally one ETL is sufficient for a perovskite layer.

The perovskite layer 113' is generally at least several hundred of nms thick. The super cap 220 comprises a positive electrode 121', a separator 122' and the negative electrode 123'. The negative electrode 115' of the SC 210 being in direct contact with one side of the CuOHNT electrode 123' of the super cap 220 provides a shared electrode 115'/123' that functions as the anode for both the SC 210 and the super cap 220. The SC 210 can use a side of the copper ribbon providing the negative electrode 115' that is not grown with CuOHNTs.

FIG. 2B shows an example charge transfer mechanism for the IEHSD 250 shown in FIG. 2A as the optically transparent top positive electrode 111' of the SC 210 and positive electrode 121' of the super cap 220 are connected to form a closed circuit (when switch S1 is closed). With S1 closed the photo generated holes and electrons from the SC 210 flow into the positive electrode 121' (cathode) and negative electrode 123' (anode), respectively, of the super cap 220. This current flow leads to the charging of the super cap 220. The energy stored in the super cap 220 through the charging process (with S1 closed) can be discharged to do external work by opening S1 and closing S2.

The switches S1 and S2 shown can be connected externally. Although not shown, driver circuits (not shown) coupled to the control node of the switches generally controls the switches, such as a gate driver integrated circuit (IC) coupled to gates of metal-oxide-semiconductor field-effect transistor (MOSFET) switches. There can also be a charge controller connected where the charge controller is adjustable so as to regulate power generated by the SC 210 to maximum amounts acceptable for charging a particular SD. For example, a lithium ion battery generally needs a charge controller to limit the charging rate to prevent damaging the battery.

Figure 3:
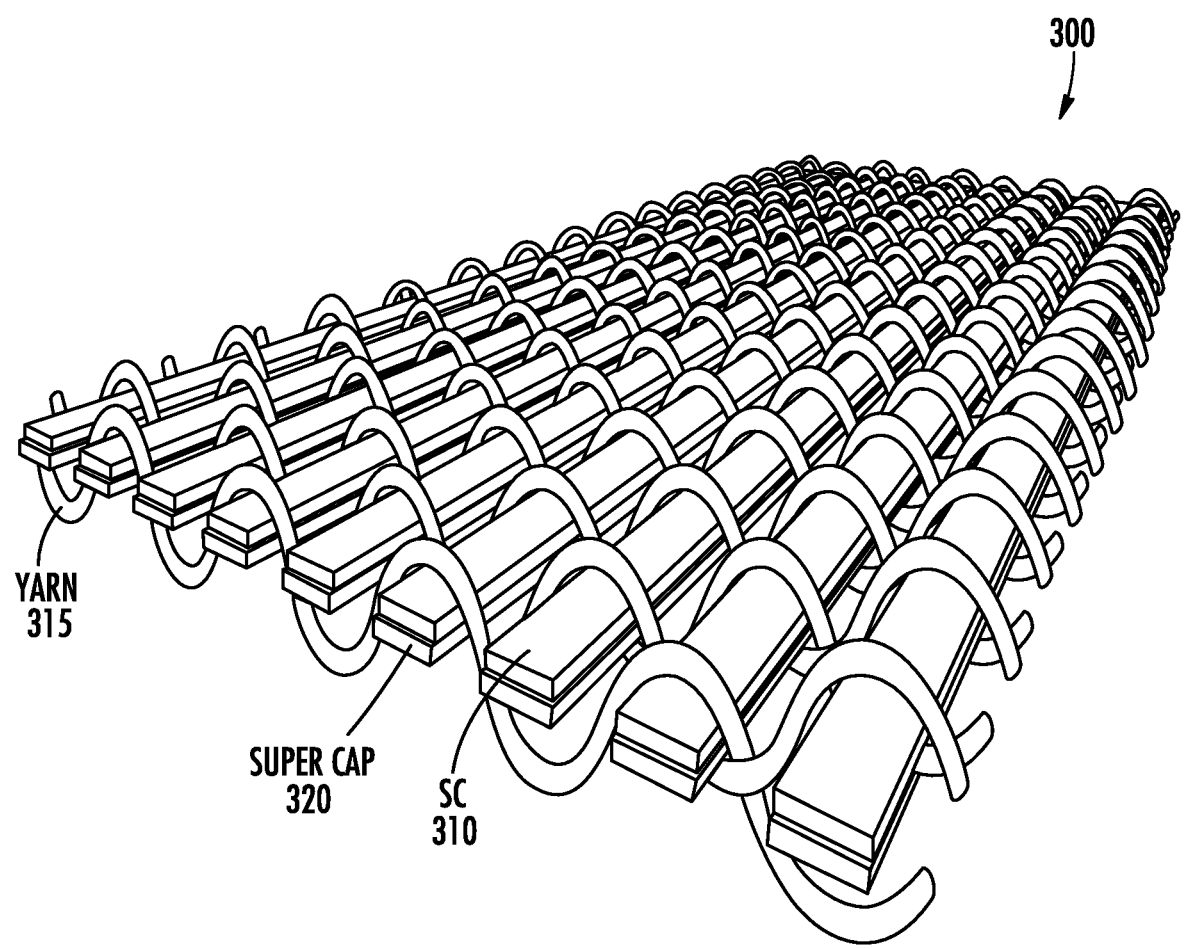
FIG. 3 is a perspective top schematic view showing an example 2D weaved IEHSD comprising stacked filaments of SC and SD weaved together by a yarn.

FIG. 3 is a perspective top schematic view showing an example 2D weaved IEHSD 300 comprising filaments of SC 310 stacked on filaments of super cap 320 weaved together by a yarn 315, such as cotton yarn. The stacks of SC 310 on super cap 320 as described above can be connected in series to increase the voltage provided by the IEHSD or in parallel to increase the current provided by the IEHSD.

To form a disclosed woven IEHSD's stacked filaments from metal (e.g., copper) ribbon substrates of each device (SC on SD) can be weaved together into a fabric or a matrix. The fabric interlocks ones of the plurality of stacked SC/SD filaments by crossing over and under adjacent stacked SC/SD filaments as shown in FIG. 3. Conductive filaments (e.g., copper ribbons) can be woven in parallel or series to achieve high current or high voltage generation, respectively. The yarns in the horizontal direction (weft) may be inserted in a 'shed' that is formed by displacing alternate yarns that run perpendicular direction (warp) in opposite directions by using a shedding mechanism such as those commonly used in a loom. The fabric is formed by the interlacing of vertical and horizontal yarns. The shed formation facilitates the interlacing. After lamination, a IEHSD comprising a plurality of stacked SC/SD filaments can be weaved together which can further be encapsulated, such as by dipping it into a Polydimethylsiloxane (PDMS) or polyurethane solution. Some preliminary measurements showed that such encapsulated IEHSDs keep more than 80% solar conversion efficiency for several weeks to several years.

Non-crimp fabric preforms and fiber structures for fiber can also be formed. It is possible to weave ribbons into non-crimp preforms to make an energy-smart structure. Non-crimp fabrics have minimal filament interlacing and extremely long float lengths, and this design offers several advantages such as increased axial strength in the direction of filament orientation, and can even include penetration of resin in bonded composite structures resulting in a higher weight fraction of fiber. Resin bonded structures ensure the structural integrity of the interconnections between and the ribbon/filament and the electrodes. Woven circuits have been designed using similar electrically conductive filaments and are in commercial use. The filaments provide the added capability of energy storage and availability of energy on demand that enables autonomous energy scavenging fabrics and composites that do not require an external power source.

Various arrangements of 2D and 3D fabrics can be woven as interlocked fabrics using appropriate weave repeats to support parallel and serial woven circuits that can allow charge aggregation. This can also provide a scalable system to build up potential difference based on aggregation of storage units (supercapacitor filaments) and simultaneous discharge from capacitive repeats. 3D fabrics of various shapes can be woven on orthogonal loom which comprises three sets of yarns warp (x-yarns), weft (y-yarns), and z-yarns.

There is generally no interlacing between the warp and the weft yarn which can remain non-crimped or minimally crimped as it is generally the z-yarns that interlace the fabric over the weft yarn. Minimal crimp allows intricate filament structures and potentially integrated filaments to be woven. This structure can fully utilize the mechanical properties of the fiber along the x and y orientation while the z yarns resist delamination. The increased porosity of the structure allows for even resin penetration (for encapsulation and protection from the environment). This system is widely used in the manufacture of preforms for automobiles and other structural elements. Orthogonal weaving machines are commercially available and can be modified to produce 3D fabrics of various shapes. 2D weaving is simpler, where existing dobby/rapier mechanisms can be modified to insert filaments.

The woven circuits can comprise SC and super cap filaments as separate devices or as a single integrated device (e.g., with single shared negative electrode layer), where conductive filaments woven in parallel or series such that charge produced by the SC can be transported to the electrodes of the super cap. From the super cap, the charges can be transported to a certain location on the matrix and can be discharged on-demand using another set of weaved connection wires. It is also possible to make a 3D woven preform comprising of conducting super capacitor filaments and z yarns that bind the warp and weft while resulting in minimal crimp to the super capacitor filaments.

Advantages of disclosed IEHSDs include power harvesting from a SC which can fully charge an SD such as a super cap or a battery. Example uses for disclosed IEHSDs include on the roof of motor vehicles for electric vehicles and on the roof of buildings, as well as smart glass and windows. Regarding weaved IEHSDs, the design of non-crimp fabrics offers several advantages such as increased axial strength in the direction of filament orientation, even as described above penetration of resin in bonded composite structures resulting in a higher weight fraction fiber. Other example uses for weaved IEHSDs include textiles including wearable electronics, fuselage of planes and drones, and robust energy harnessing emergency chargers.

Figure 4:
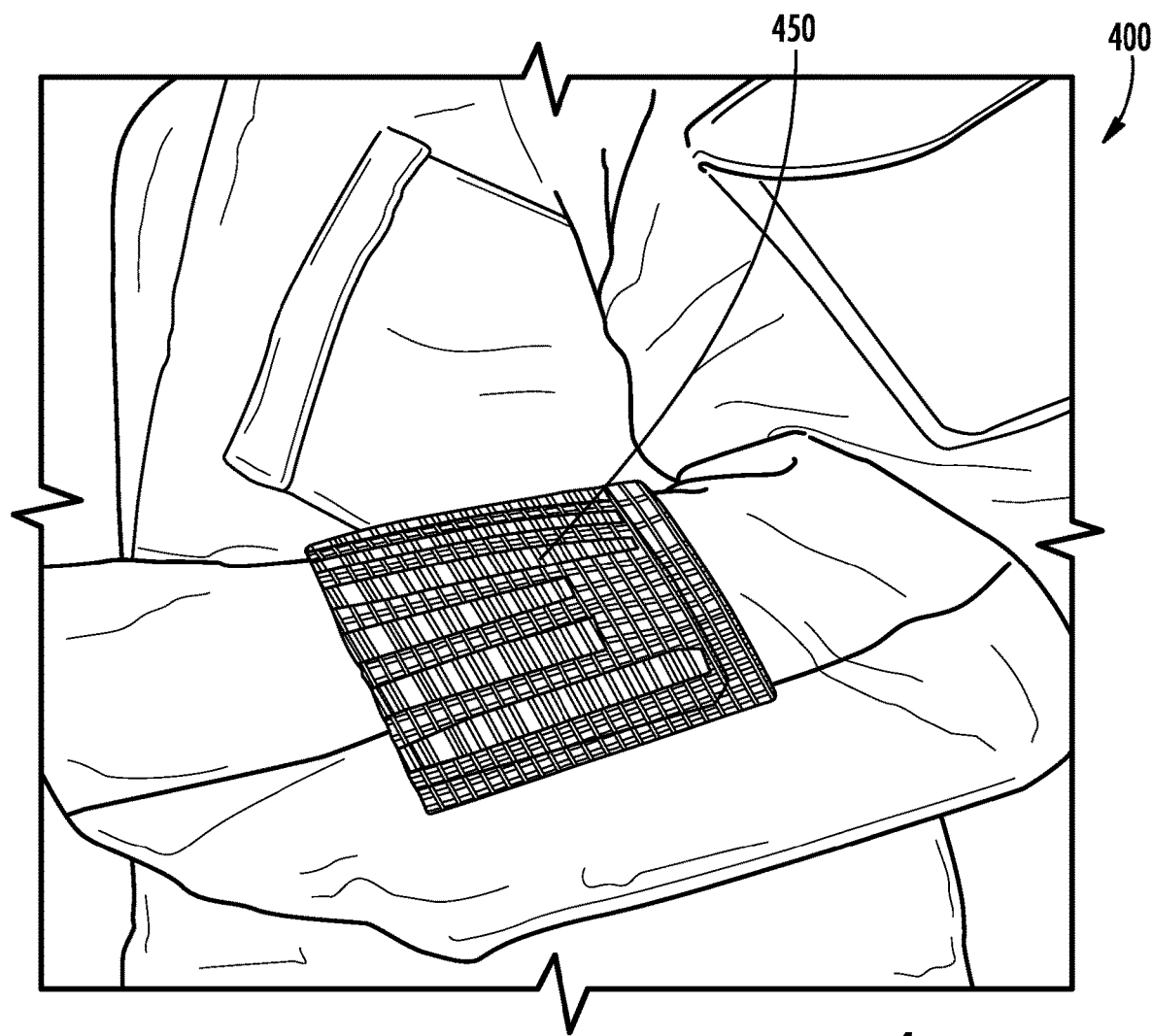
FIG. 4 is a scanned photograph showing a military uniform incorporating a disclosed lightweight fabric woven IEHSD having cotton threads.

FIG. 4 shows a scanned photograph of an example wearable electronic clothing article 400 comprising a military uniform incorporating a lightweight fabric woven with a disclosed IEHSD 450 woven in such as having cotton threads. Although one disclosed IEHSD 450 is shown, disclosed articles can include a plurality of IEHSDs.

EXAMPLES

Disclosed embodiments are further illustrated by the following specific Examples, which should not be construed as limiting the scope or content of this Disclosure in any way.

For one specific example, for a super cap having a copper ribbon 2 mm in width and 8 inches in length, copper oxide nanowhiskers (CuO NWs) can be grown on the copper ribbon by a relatively simple oxidative heat treatment in air. For example, a thin copper ribbon can be cleaned and rapidly heated to about 500° C. in air at a heating rate of about 20° C. min$^{-1}$ to form CuONWs. In order to render the surface of the CuO whiskers electrically conductive, an electrically conductive layer such as a metal, for example aluminum, can be deposited on the CuO NWs.

Preparation of an electroactive material such as MnO$_2$ on the Cu NWs cathode (NW-MnO$_2$) follows. The cathode can be prepared by electrodeposition of an electroactive material such as MnO$_2$ onto an NW electrode, for example at a constant current density of 0.5 mA cm$^{-2}$. In one specific example process, the electrolyte for the deposition can be prepared by dissolving 0.01M of manganese acetate (MnAc$_2$) and 0.02 M ammonium acetate (NH$_4$Ac) in a solvent mixture of 90% deionized (DI) water and 10% dimethyl sulfoxide (DMSO).

For forming a nanostructured cathode for the super cap on a copper ribbon, wet-preparation of graphitic ink coated CuNW anode (CuNW-graphitic ink) can be used. The graphitic anode can be fabricated by coating graphitic ink on CuNWs from solution on the inside of a thin copper ribbon made of copper foil. Briefly, CuNWs can be coated with graphitic particles by dip coating in a commercially available graphitic ink. The outside of the ribbon can be masked using a tape or other masking material to prevent the deposition of graphite powder on this side. The ink can be dried by passing it through a hot air oven. The needed thickness of graphitic layer can be obtained by repeating the dipping process.

Solar cell filaments can be formed layer-by-layer starting with a metal ribbon such as a copper ribbon or on a carbon cloth/ribbon/filament (made of carbon fibers/carbon nanotubes), or any other conductive substrate. As described above, in one embodiment, the SC is formed on an opposite side of the ribbon after forming the super cap on one side of the ribbon and masking to protect the super cap.

Regarding development of a super cap ribbon/filament, the super cap can be assembled using a disclosed copper ribbon/filament cathode and anode. Before assembling, both electrodes can be immersed into a gel electrolyte. Since the outer surface of the tubular cathode is generally masked with masking tape or other masking material, no electrolyte adhesion takes place on this surface. A gel electrolyte can be prepared by mixing lithium chloride (LiCl) and polyvinyl alcohol (PVA) in de-ionized water. Other example electrolyte materials include (but are not limited to) potassium hydroxide, sulfuric acid and sodium nitrate, which can be used instead of LiCl in PVA. A solid state ribbon/filament supercapacitor can conveniently fabricated by gluing the outer two electrodes (thin copper foil ribbon) with the inner electrode using PVA electrolyte, with an ion-porous membrane in between.

A SC such as a perovskite SC can be fabricated on a copper ribbon/filament. Perovskite SCs are known to convert a broader spectrum of sunlight into electricity compared to conventional silicon-based cells. However, as described above a thin film silicon solar cell can be used instead of a perovskite SC.

A perovskite SC on a copper ribbon of 2 mm (0.079 inches) in width, and 178 mm (7 inches) in length was actually developed. The copper ribbon had an electrically conductive adhesive on both sides. The fabrication started with the coating of a thin layer (~40 nm) of a hole transport layer comprising Poly(3,4-ethylenedioxythiophene) Polystyrene sulfonate (PEDOT:PSS) on the PET-ITO flexible electrode (as the transparent top positive electrode) which is of about the same size as the copper ribbon. The deposition can be performed by spin coating after fixing the PET-ITO film on a mechanically sturdy substrate. The solvent can be evaporated off by heating it at about 110° C. This was followed by a deposition of methyl ammonium iodide (CH$_3$NH$_3$I) and lead acetate (Pb (COOCH$_3$)$_2$) as the perovskite precursor according to the reaction given below to form the perovskite layer to provide the active layer for the SC: 3CH$_3$NH$_3$I+Pb(COOCH$_3$)$_2$→CH$_3$NH$_3$PbI$_3$+CH$_3$NH$_3$(COOCH$_3$)$_2$.

By using PbAc instead of PbX$_2$, the rate of perovskite growth, by-product removal and solvent evaporation can take place much faster. In addition, this method enables casting the perovskite active layer in a one-step solution-based process. Following the PbAc method, the annealing temperature can be reduced from 150° C. for a typical lead halide process to 100° C. Moreover, annealing time can be reduced to less than 5 minutes compared to about an hour for lead iodide-based process. Reducing the processing time and temperature can have a considerable impact on a large scale production of this device. An electron transport layer 114, such as comprising PCBM, with a thickness of about 40 nm can be spin coated on top of the perovskite active layer. After PCBM deposition, one of the adhesive sides of the copper ribbon can be attached to provide the negative electrode 115 to form a completed SC device.

By using a flexible copper ribbon as an anode (negative electrode 115), a working perovskite SC providing a relatively PCE of 10.41% was achieved along with a much improved environmental stability that is important for commercial applications. Using a copper ribbon as the second electrode instead of a vapor deposited metal plays an important role for enhancing the stability of SCs because it effectively blocks the permeation of moisture and oxygen into the perovskite layer 113' and the device was found to deliver one of the best performances known for sandwich-type perovskite SCs. The current vs. voltage (I-V) curve of an example copper ribbon perovskite SC revealed a short circuit photocurrent density (Jsc) of 16.44 mA/cm$^2$, an open-circuit voltage (Voc) was 0.96V, and a fill factor (FF) of 66%.

Figure 5A:
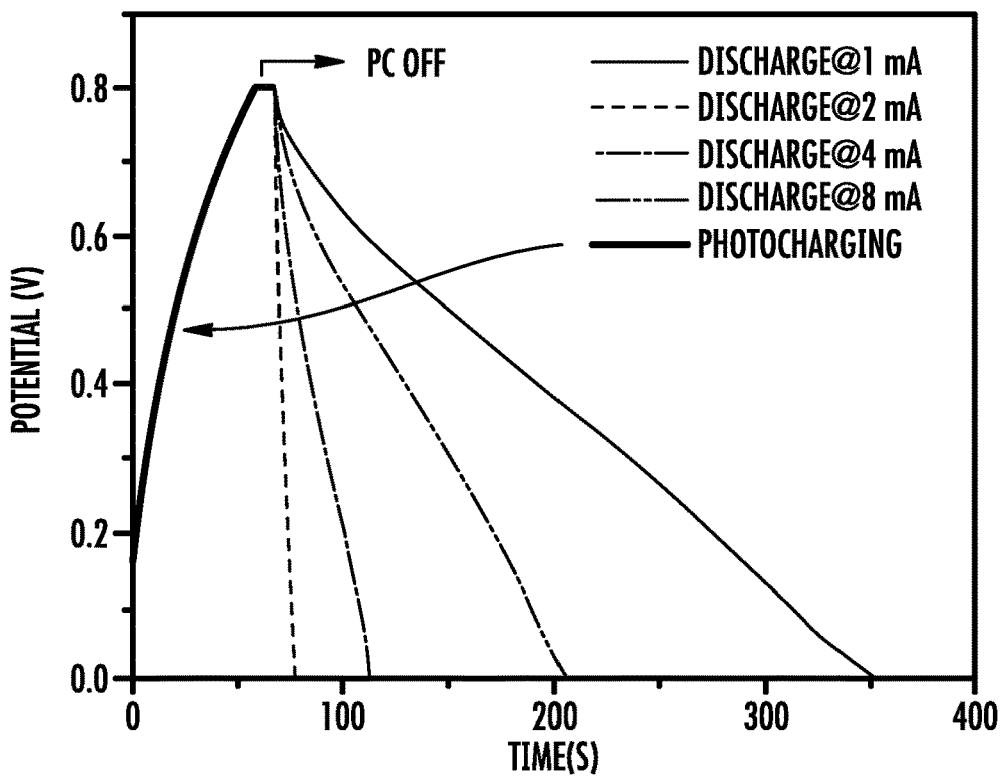
FIG. 5A shows data being a charge—discharge profile of an example the IEHSD. The solar side of the IEHSD ribbon was charged with a solar simulator for 1 min and discharged with an electrochemical workstation at different current densities after 10 s of the photocharging being off.

FIG. 5A shows data being a measured charge—discharge profile for an example disclosed IEHSD in ribbon form. The SC side of the IEHSD was charged with a solar simulator for 1 min and the super cap was discharged with an electrochemical workstation at different current densities after 10 s of the photocharging (PC) being off. Discharge is shown at various discharge currents from 1 mA to 8 mA.

Figure 5B:
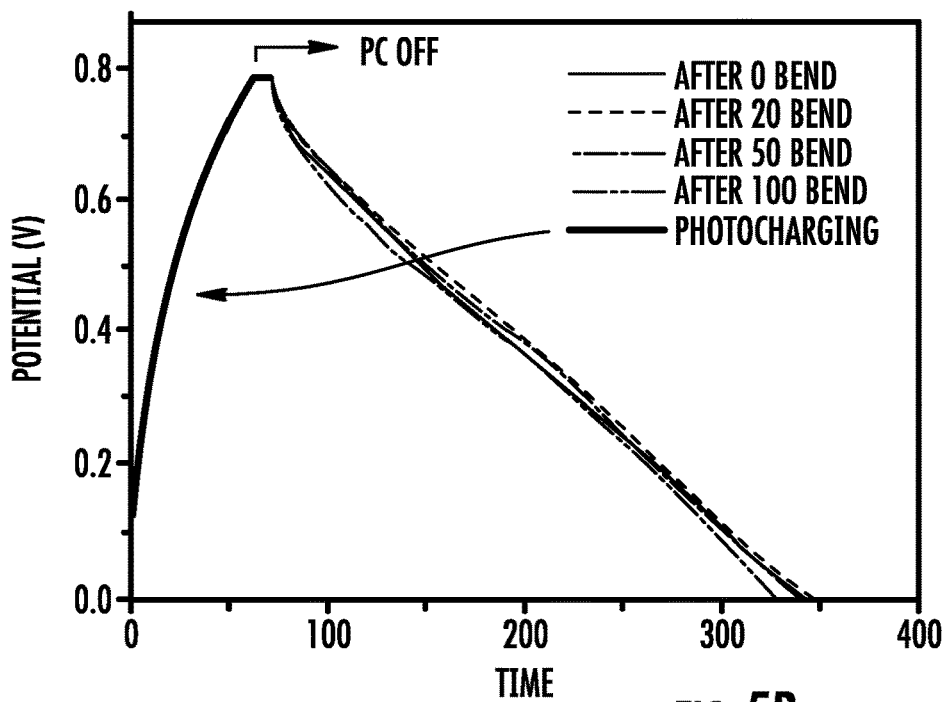
FIG. 5B shows data being a charge—discharge profile of an IEHSD ribbon after a different bending cycles, where the IEHSD was photocharged for 1 min, and then again removed from photocharging 10 sec before discharging.

FIG. 5B shows data being a charge-discharge profile for an example IEHSD in ribbon form after different bending cycles. The IEHSD was photocharged for 1 min, and was then removed from light 10 s before discharging the super cap.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

The invention claimed is:

1. An integrated energy harvesting and storage device (IEHSD), comprising:
   a solar cell (SC) including an active layer between an optically transparent top electrode and a bottom electrode;
   an energy storage device (SD) secured below the SC including a separator between a first electrode and a second electrode,
   wherein the bottom electrode and one of the first or the second electrode are electrically common, and wherein the bottom electrode is formed from a first side of a single metal material comprising a copper ribbon and the one of the first or second electrode is formed from a second side of the single metal material opposite the first side, the second side of the single metal material comprising copper hydroxide nanotubes and the first side of the single metal material being absent copper hydroxide nanotubes; and
   a connection between the optically transparent top electrode and the other of the first electrode and the second electrode for photo generated carriers generated by the SC to flow to and charge the SD.

2. The IEHSD of claim 1, wherein the SD comprises a supercapacitor.

3. The IEHSD of claim 1, wherein the SC comprises a perovskite solar cell.

4. The IEHSD of claim 1, wherein the SD comprises a lithium ion battery.

5. A woven integrated energy harvesting and storage device (IEHSD), comprising:
   a solar cell (SC) including a plurality of SC filaments each including an active layer between an optically transparent top electrode and a bottom electrode that are aligned with one another;
   an energy storage device (SD) comprising a plurality of SD filaments each including a separator between a first electrode and a second electrode secured below the SC filaments to provide a plurality of stacked SC/SD filaments, wherein the plurality of SD filaments and the plurality of SC filaments share an electrically common electrode;
   a yarn material that is separate from the plurality of SC filaments and the plurality of SD filaments, the yarn material comprising first vertical yarns oriented in a vertical direction and second horizontal yarns oriented in a horizontal direction, wherein the first vertical yarns and the second horizontal yarns are interlaced together to provide a fabric, the fabric interlocking ones of the plurality of stacked SC/SD filaments together by crossing over and under adjacent ones of the plurality of stacked SC/SD filaments,
   wherein the electrically common electrode comprises the bottom electrode and one of the first or the second electrode, and wherein the bottom electrode is formed from a first side of a single metal material comprising a copper ribbon and the one of the first or second electrode is formed from a second side of the single metal material opposite the first side, the second side of the single metal material comprising copper hydroxide nanotubes and the first side of the single metal material being absent copper hydroxide nanotubes; and
   a connection between the optically transparent top electrode and the other of the first electrode and the second electrode for photo generated carriers generated by the SC to flow to and charge the SD.

6. The woven IEHSD of claim 5, wherein the plurality of SD comprises a supercapacitor.

7. The woven IEHSD of claim 5, wherein the plurality of SC filaments comprise a perovskite SC.

8. The woven IEHSD of claim 5, wherein the plurality of SC filaments comprise a silicon SC.

9. The woven IEHSD of claim 5, wherein the plurality of SD filaments comprise a lithium ion battery.

10. The woven IEHSD of claim 5, wherein the plurality of SD filaments and the plurality of SC filaments are on opposite sides of the electrically common electrode, and wherein a positive electrode of the plurality of SC filaments is connected through a switch to a positive electrode of the plurality of SD filaments.

11. The woven IEHSD of claim 5, wherein the woven IEHSD is part of a clothing article.

12. The IEHSD of claim 1, wherein the SD comprises a nanostructured surface on the one of the first electrode or the second electrode.

13. The woven IEHSD of claim 5, wherein the SD comprises a nanostructured surface on the one of the first electrode or the second electrode.

14. The IEHSD of claim 1, wherein the other of the one of the first electrode or the second electrode comprises copper hydroxide nanotubes.

15. The woven IEHSD of claim 5, wherein the other of the one of the first electrode or the second electrode comprises copper hydroxide nanotubes.

16. An integrated energy harvesting and storage device (IEHSD), comprising:
   a solar cell (SC) including an active layer between an optically transparent top electrode and a bottom electrode;
   an energy storage device (SD) secured below the SC including a separator between a first electrode and a second electrode,
   wherein the bottom electrode and the first electrode are electrically common, the bottom electrode comprising a first copper ribbon having a first side with copper hydroxide nanotubes and a second side absent the copper hydroxide nanotubes, and the first electrode comprising a second copper ribbon having copper hydroxide nanotubes, the second copper ribbon being adhered to the first side of the first copper ribbon; and
   a connection between the optically transparent top electrode and the other of the first electrode and the second electrode for photo generated carriers generated by the SC to flow to and charge the SD.

17. The IEHSD of claim 16, wherein the second electrode comprises copper hydroxide nanotubes.

* * * * *